United States Patent
Chen et al.

(10) Patent No.: US 12,414,361 B2
(45) Date of Patent: *Sep. 9, 2025

(54) METHOD OF MANUFACTURING A SEMICONDUCTOR DEVICE

(71) Applicant: TAIWAN SEMICONDUCTOR MANUFACTURING COMPANY LTD., Hsinchu (TW)

(72) Inventors: Yi-Sheng Chen, Hsinchu (TW); Kong-Beng Thei, Hsinchu County (TW); Fu-Jier Fan, Hsinchu (TW); Jung-Hui Kao, Hsinchu (TW); Yi-Huan Chen, Hsinchu (TW); Kau-Chu Lin, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 550 days.

This patent is subject to a terminal disclaimer.

(21) Appl. No.: 17/814,852

(22) Filed: Jul. 26, 2022

(65) Prior Publication Data

US 2022/0359502 A1     Nov. 10, 2022

Related U.S. Application Data

(60) Continuation of application No. 16/205,797, filed on Nov. 30, 2018, now Pat. No. 11,417,649, which is a
(Continued)

(51) Int. Cl.
*H10D 84/83*     (2025.01)
*H01L 23/528*     (2006.01)
(Continued)

(52) U.S. Cl.
CPC ........... *H10D 84/83* (2025.01); *H01L 23/528* (2013.01); *H10D 84/0149* (2025.01); *H10D 84/038* (2025.01)

(58) Field of Classification Search
CPC .. H10D 84/83; H10D 84/0149; H10D 84/038; H10D 30/60; H10D 64/514;
(Continued)

(56) References Cited

U.S. PATENT DOCUMENTS

2005/0116265 A1*   6/2005   Inoue ................. H10D 84/0188
257/E21.551

\* cited by examiner

*Primary Examiner* — Karen Kusumakar
(74) *Attorney, Agent, or Firm* — WPAT LAW; Anthony King

(57) ABSTRACT

A method of manufacturing a semiconductor device, including: forming a dielectric layer configured to be a gate oxide contacting the second well on the substrate, wherein the dielectric layer is single-layered dielectric layer and includes a contact via penetrating through the dielectric layer; and forming a patterned conductive layer contacting the dielectric layer, wherein the patterned conductive layer includes a first conductive portion isolated from the second well and configured to be a gate electrode, and a second conductive portion coupled to the first well via the contact via; wherein the first conductive portion is leveled with the second conductive portion, and the first conductive portion and the second conductive portion are formed entirely on a topmost surface of the dielectric layer; wherein the dielectric layer and the first conductive portion collectively serve as a gate of the transistor, and the transistor is configured as a high-voltage transistor.

20 Claims, 17 Drawing Sheets

Related U.S. Application Data division of application No. 15/061,596, filed on Mar. 4, 2016, now Pat. No. 10,937,785.

(60) Provisional application No. 62/288,806, filed on Jan. 29, 2016.

(51) Int. Cl.
*H10D 84/01* (2025.01)
*H10D 84/03* (2025.01)

(58) Field of Classification Search
CPC ............ H10D 64/665; H10D 84/0142; H10D 84/0144; H01L 23/528
See application file for complete search history.

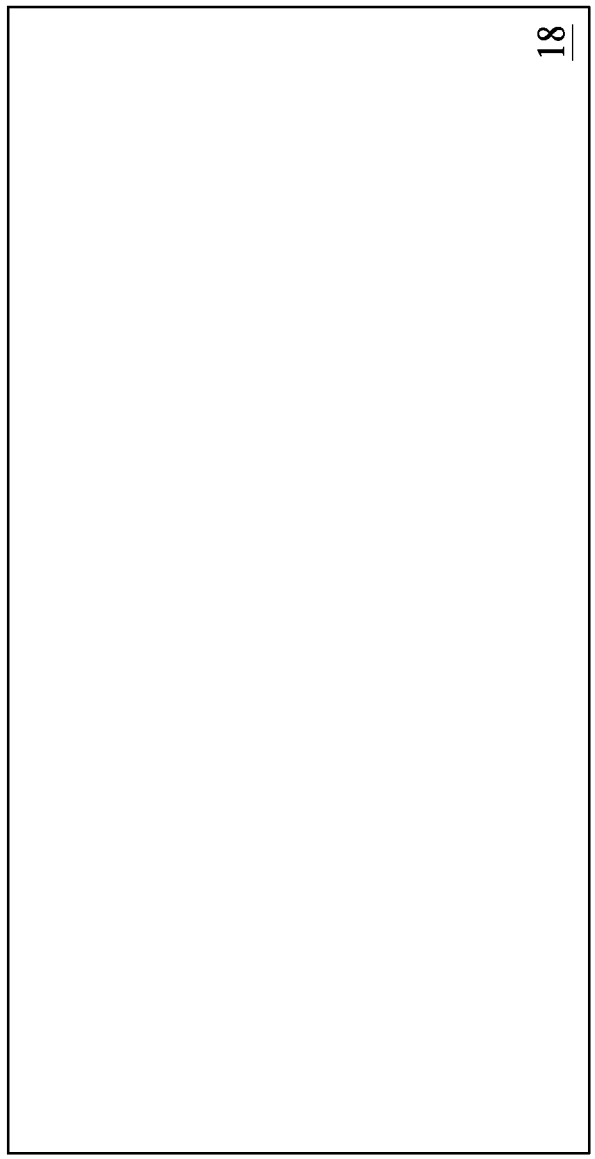

FIG. 3B

METHOD OF MANUFACTURING A SEMICONDUCTOR DEVICE

CROSS-REFERENCE TO RELATED APPLICATIONS

This application is a continuation of U.S. application Ser. No. 16/205,797, field on Nov. 30 2018, which is a divisional of U.S. application Ser. No. 15/061,596, filed on Mar. 4, 2016, which claims priority to U.S. Provisional Application No. 62/288,806, filed on Jan. 29, 2016, which application is hereby incorporated herein by reference.

BACKGROUND

High-voltage metal-oxide-semiconductor (HVMOS) devices are widely used in many electrical devices, such as input/output (I/O) circuits, central processing unit (CPU) power supplies, power management systems, and alternating current/direct current (AC/DC) converters. There are a variety of forms of HVMOS devices. A symmetric HVMOS device may have a symmetric structure on the source side and drain side. High voltage can be applied on both drain and source sides. In contrast, an asymmetric HVMOS device may have asymmetric structures on the source side and drain side.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1C to 1F are diagrams showing a method of manufacturing the transistor of the semiconductor device shown in FIG. 1A, in accordance with some embodiments of the present disclosure.

FIGS. 3B to 3G are diagrams showing a method of manufacturing the semiconductor device shown in FIG. 3A, in accordance with some embodiments of the present disclosure.

DETAILED DESCRIPTION

Figure 1A:
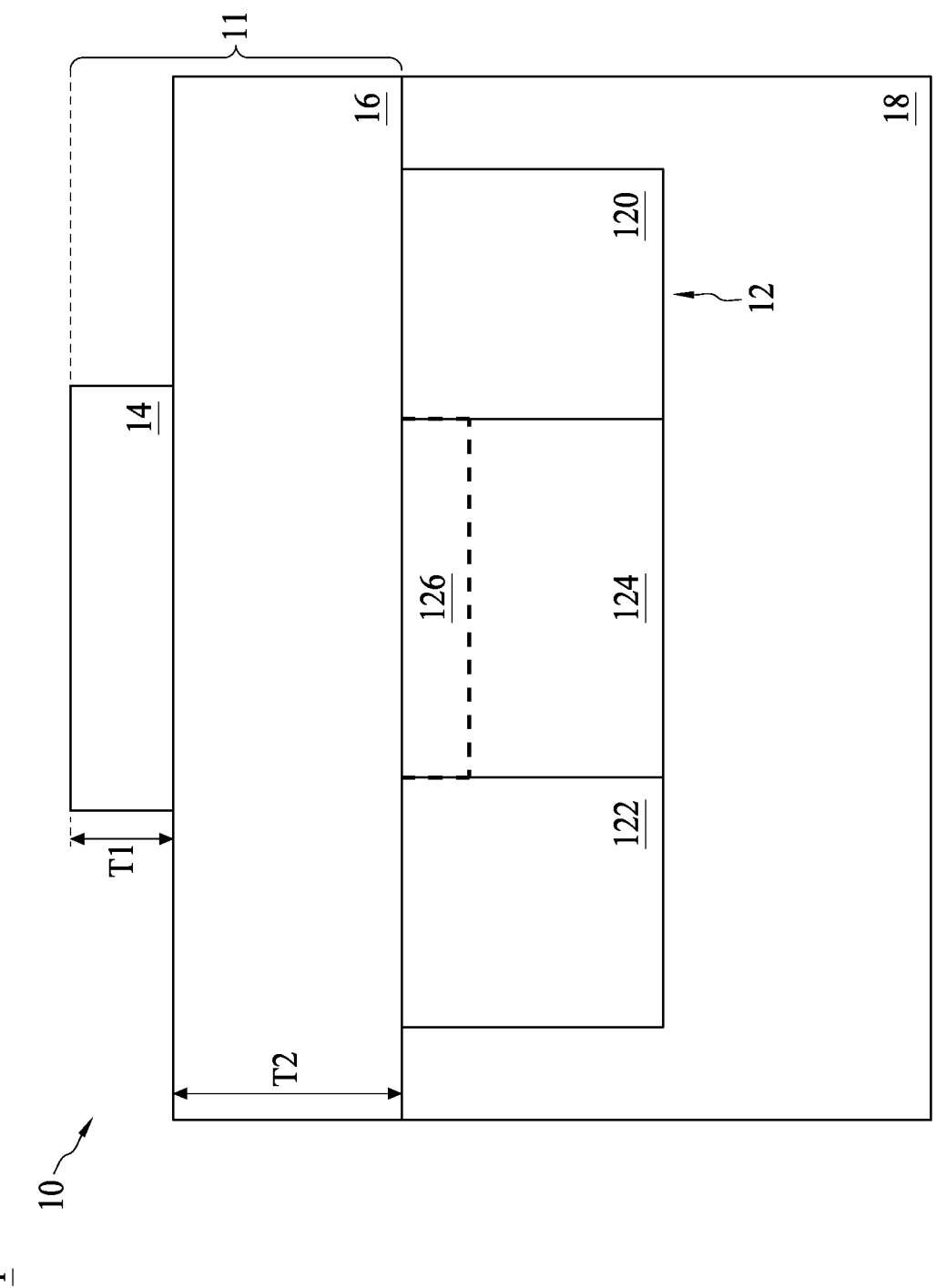
FIG. 1A is a cross-sectional view of a transistor of a semiconductor device, in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A is a cross-sectional view of a transistor 10 of a semiconductor device 1, in accordance with some embodiments of the present disclosure. Referring to FIG. 1A, the transistor 10 includes a gate 11 on a substrate 18, and an active region 12 in the substrate 18.

In some embodiments, the substrate 18 includes a semiconductor material such as silicon. In other embodiments, the substrate 18 includes silicon germanium, gallium arsenic, or other suitable semiconductor materials. In some other embodiments, the substrate 18 further includes other features such as a buried layer, and/or an epitaxy layer. The buried layer may be doped with antimony (Sb) via ion implantation to a concentration of about $5.0 \times 10^{13}$ to about $1.5 \times 10^{14}$ at an energy between about 70 keV and about 90 keV, and to a depth of greater than about 2 micrometers. Skilled artisans will recognize that other n-type dopants may be used depending on the design requirements of the device. For example, antimony exhibits less autodoping during epitaxy and the following heat cycles, but has a lower solubility limit compared to arsenic, which may necessitate higher anneal temperatures to activate the antimony. Furthermore, in some embodiments, the substrate 18 is semiconductor on insulator such as silicon on insulator (SOI). In other embodiments, the semiconductor substrate 18 includes a doped epi layer, a gradient semiconductor layer, and/or further includes a semiconductor layer overlying another semiconductor layer of a different type such as a silicon layer on a silicon germanium layer. In some other examples, a compound semiconductor substrate includes a multilayer silicon structure or a silicon substrate may include a multilayer compound semiconductor structure. In some embodiments, the substrate 18 may include other elementary semiconductors such as germanium and diamond. In some embodiments, the substrate 18 includes a compound semiconductor such as, silicon carbide, gallium arsenide, indium arsenide, or indium phosphide.

The gate 11 includes a patterned conductive layer 14 serving as its gate electrode, and an insulating layer 16 serving as its gate oxide.

The patterned conductive layer 14 is disposed on the insulating layer 16, which in turn is disposed on the active region 12, The active region 12 includes a first well 124, where a channel 126 is defined. The first well 124 of a first dopant type is disposed between a second well 120 and a third well 122 both of a second dopant type opposite to the first dopant type. The second well 120 serves as a first source/drain region of the transistor 10, and the third well 122 serves as a second source/drain region of the transistor

10. In the present embodiment, the substrate 18 is a p-type substrate, the first well 124 includes a high voltage n-well (HVNW), and each of the second well 120 and the third well 122 includes a high voltage p-well (HVPW). As a result, the transistor 10 includes a p-type transistor structure. For example, the transistor 10 includes a p-type metal-oxide-semiconductor (PMOS) transistor, or a p-type metal-oxide-semiconductor field effect transistor (PMOSFET). Although only one gate structure is illustrated, it is understood that the transistor 10 may include a number of gate structures for PMOS transistors, including short channel and long channel transistors.

Those skilled in the art will recognize that the embodiments disclosed herein by way of a PMOS transistor may also be applicable to an NMOS transistor, an n-type metal-oxide-semiconductor field effect transistor (NMOSFET), and an NPN transistor. For example, the first well 124 includes a high voltage p-well, and each of the second well 120 and the third well 122 includes a high voltage n-well. Additionally, while the dopants discussed in specific terms and with reference to specific doping materials, concentrations and doping depths, those skilled in the art will recognize that alternative doping characteristics may be advantageously employed.

Furthermore, the patterned conductive layer 14 is, for example, formed in an interconnection layer such as a metal-1 (M1) layer in a semiconductor manufacturing process. Furthermore, since the patterned conductive layer 14 is a portion of the metal-1 layer, unlike some existing transistors, the patterned conductive layer 14 is free of spacers at its sides. Accordingly, the process for manufacturing the transistor 10 in the present embodiment is relatively simple.

In the present embodiment, a layer (such as the patterned conductive layer 14) serving as a gate electrode is in a metal-1 layer. However, the present disclosure is not limited thereto. In another embodiment, a layer in a metal-2 layer serves as a gate electrode of the transistor 10.

The insulating layer 16, serving as another component of the gate 11 of the transistor 10, fully covers the active region 12. Moreover, the insulating layer 16 fully covers the substrate 18 as the patterned conductive layer 14 forms a portion of an interconnection layer. The insulating layer 16 is configured to insulate the active region 12 from the patterned conductive layer 14. Ideally, with the insulating layer 16, the active region 16 is electrically isolated from the patterned conductive layer 14 if there is not any interconnection features therebetween to couple one to the other.

In an embodiment, the insulating layer 16 includes an interlayer dielectric (ILD) layer. The insulating layer 16 includes doped silicon glass such as phosphorous silicon glass (PSG) or boron phosphorous silicon glass (BPSG). In some embodiments, the insulating layer 16 includes silicon oxide, silicon nitride, silicon oxynitride, spin-on glass (SOG), fluorinated silica glass (FSG), carbon doped silicon oxide (e.g., SiCOH), BLACK DIAMOND® (Applied Materials of Santa Clara, Calif.), XEROGEL®, AEROGEL®, amorphous fluorinated carbon, Parylene, BCB (bis-benzocyclobutenes), FLARE®, SILK® (Dow Chemical, Midland, Mich.), polyimide, other proper porous polymeric materials, other suitable dielectric materials, and/or combinations thereof. In some embodiments, the insulating layer 16 includes a high density plasma (HDP) dielectric material (e.g., HDP oxide) and/or a high aspect ratio process (HARP) dielectric material (e.g., HARP oxide).

The insulating layer 16 has a thickness T2, and the patterned conductive layer 14 has a thickness T1. In an embodiment, the thickness T2 of the insulating layer 16 is about 1200 angstrom (Å). It is understood that the insulating layer 16 may include one or more dielectric materials and/or one or more dielectric layers.

In some existing transistors, a gate structure of a transistor includes a gate oxide, and a poly serving as a gate electrode. A total thickness of the gate structure is ideally the sum of the thickness of the gate oxide and poly. Typically, a dielectric layer is adapted to cover the gate and an active region of the transistor, such that the gate and the active region are insulated from a metal layer (such as a metal-1 layer) for routing. In order to cover the gate of the transistor, the thickness of the gate is not allowed to be thicker than that of the dielectric layer. Otherwise, the gate cannot be covered by the dielectric layer, and consequently the gate of the transistor may physically contact a patterned conductive layer for routing. The transistor may accordingly work abnormally and even be damaged.

With the continuous development in semiconductor manufacturing, dimensions or features of a semiconductor device become increasingly smaller. As a result, the thickness of a dielectric layer in the semiconductor device also shrinks as well. However, in some applications, such as power supply systems, a semiconductor device is asked for enduring a relatively high voltage. Taking such a transistor for instance, to sustain the relatively high voltage, thickness of a gate oxide of the transistor would become relatively thicker, which is against the trend of downsizing in semiconductor manufacturing. Nevertheless, in such applications, the gate is inevitably thicker than the dielectric layer.

In an embodiment, in a high voltage application, the thickness of a gate oxide of a transistor for enduring the high voltage is approximately 800 angstrom. Furthermore, the thickness of a poly of the transistor is approximately 800 angstrom. Therefore, a total thickness of the gate on the substrate surface is approximately 1600 angstrom. For example, in the 28-nm process technology, the design rule limits the thickness of a dielectric layer measured from a substrate surface to be no more than approximately 1200 angstrom. In that case, the gate is thicker than the dielectric layer. As a result, the dielectric layer cannot cover the gate of the transistor, and accordingly cannot insulate the gate of the transistor from a patterned metal layer for routing. It is therefore desirable to have a transistor structure according to the present disclosure to meet the size requirements for the advanced processes (such as the 28-nm process technology).

In the present disclosure, the insulating layer 16 (i.e., the dielectric layer) is taken as a gate oxide of the gate 11 (i.e., as a part of the transistor 10). Such arrangement overcomes the issues of size limitation encountered by the existing transistors. In the advanced processes, the insulating layer 16 may has a thickness smaller than 1200 angstrom (Å). Moreover, since the insulating layer 16 is typically thicker than the gate oxide of the existing transistors, the transistor 10 according to the present embodiment is able to sustain a higher voltage than the existing transistors.

Furthermore, in the existing transistors, a poly serving as a gate electrode is independent of a metal-1 layer for routing. Contrarily, in the present embodiment, the patterned conductive 14 serving as a gate electrode is a portion of an interconnection layer (such as a metal-1 layer) for routing. Taking the patterned conductive layer 14 out of the metal-1 layer for a component of the gate 11 does not make the manufacturing process complex. Besides, no additional cost is incurred. Furthermore, since the patterned conductive layer 14 takes advantage of the metal-1 layer, no spacer is required at its sides. Effectively, the manufacturing process is simplified.

In a high voltage device, an off-type breakdown voltage refers to a breakdown voltage measured under the condition that a gate of a transistor receives a reference ground voltage. Moreover, an on-type breakdown voltage refers to a breakdown voltage measured under the condition that a gate of a transistor receives a logic high voltage. The two breakdown voltages are important performance indicators of a power transistor. Typically, the on-and-off-type breakdown voltages are determined by the design of an active region (such as the first well 124, the second well 120 and the third well 122 in the present embodiment) of the transistor, and are not relative to an arrangement of a gate of the transistor. The design involves an arrangement of wells in the active region, and the associated concentration, depth and width thereof. The present disclosure overcomes the aforesaid issues due to size limitation in advanced processes without modifying (or changing) the design of the first well 124, the second well 120 and the third well 122. Therefore, the on-and-off-type breakdown voltages are not affected. Performance relative to the on-and-off-type breakdown voltages are kept substantially the same.

The present disclosure is applicable to other semiconductor devices, where the gate of a transistor can be made thicker than a dielectric layer.

Figure 1B:
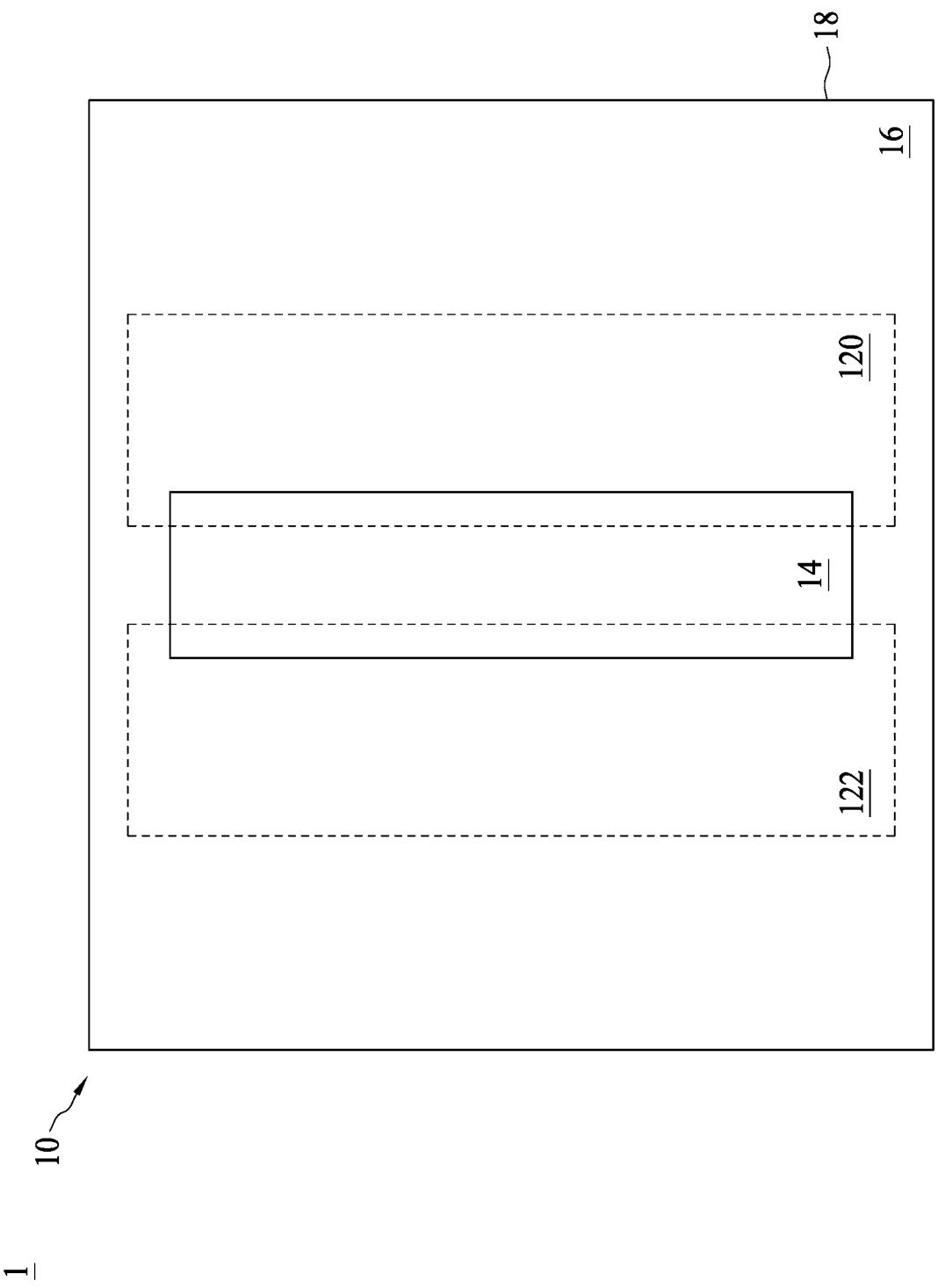
FIG. 1B is a layout view of the transistor shown in FIG. 1A, in accordance with some embodiments of the present disclosure.

FIG. 1B is a layout view of the transistor 10 shown in FIG. 1A, in accordance with some embodiments of the present disclosure. Referring to FIG. 1B, the insulating layer 16, serving as a gate oxide of the transistor 10, fully covers the substrate 18. The patterned conductive layer 14 is on the insulating layer 16, and over the second well 120 and the third well 122 in the substrate 18. Based on such layout design, for the similar reasons as those discussed and illustrated with reference to FIG. 1A, the issue that the gate of the existing transistors is thicker than a dielectric layer is prevented.

FIGS. 1C to 1F are diagrams showing a method of manufacturing the transistor 10 of the semiconductor device 1 shown in FIG. 1A, in accordance with some embodiments of the present disclosure. It is understood that FIGS. 1C to FIG. 1F have been simplified for clarity. Referring to FIG. 1C, a substrate 18 is received. In some embodiments, the substrate 18 includes a p-type substrate.

Figure 1D:
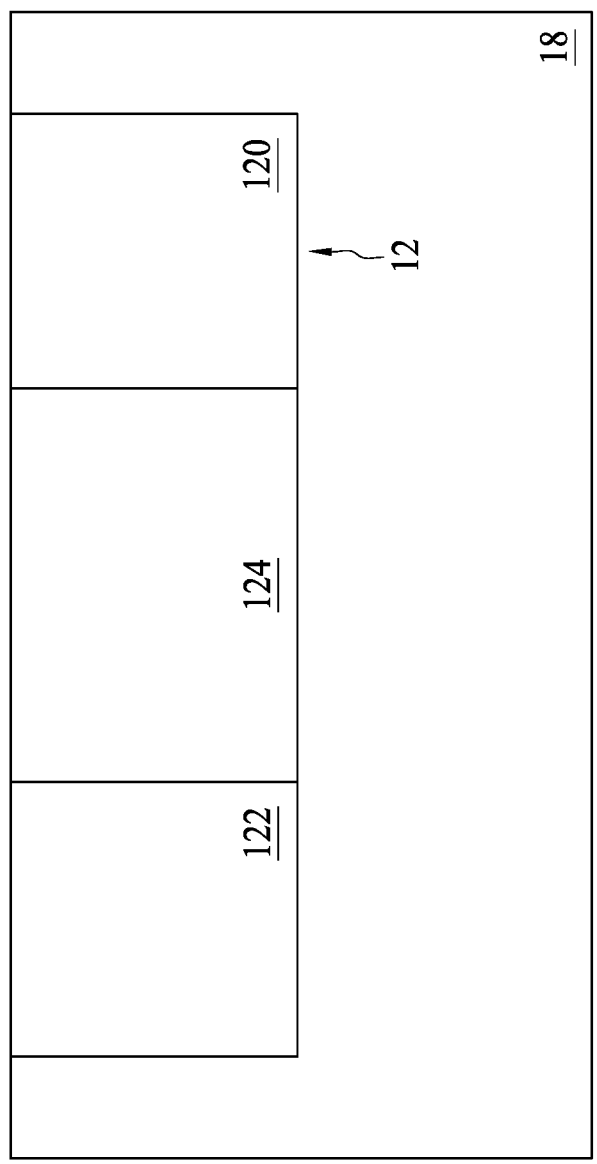

Referring to FIG. 1D, a first well 124, a second well 120 and a third well 122 are defined in the substrate 18 by, for example, a masking process and one or more ion implantation process followed by a drive-in processes. In the present embodiment, the first well 124 serves as a high voltage p-well (PVNW), and each of the second well 120 and the third well 122 serves as a high voltage n-well (HVNW). The first well 124 can be defined firstly, and then the second well 120 and the third well 122 are subsequently defined. Skilled practitioners will recognize that the order of implantation of the first well 124, the second well 120 and the third well 122 may be varied without deviating from the spirit of the presented disclosure.

In order to provide a vertically controlled profile in a doped region such as each of the first well 124, the second well 120 and the third well 122, multiple successive implants may be performed to create multiple implant regions. The successive implants may be used to tailor the doping profile by varying the implant energy, concentration and depth of each implant step. Additionally, the successive implant steps may implant different dopants to further customize the doping profile for a particular doped region.

Figure 1E:
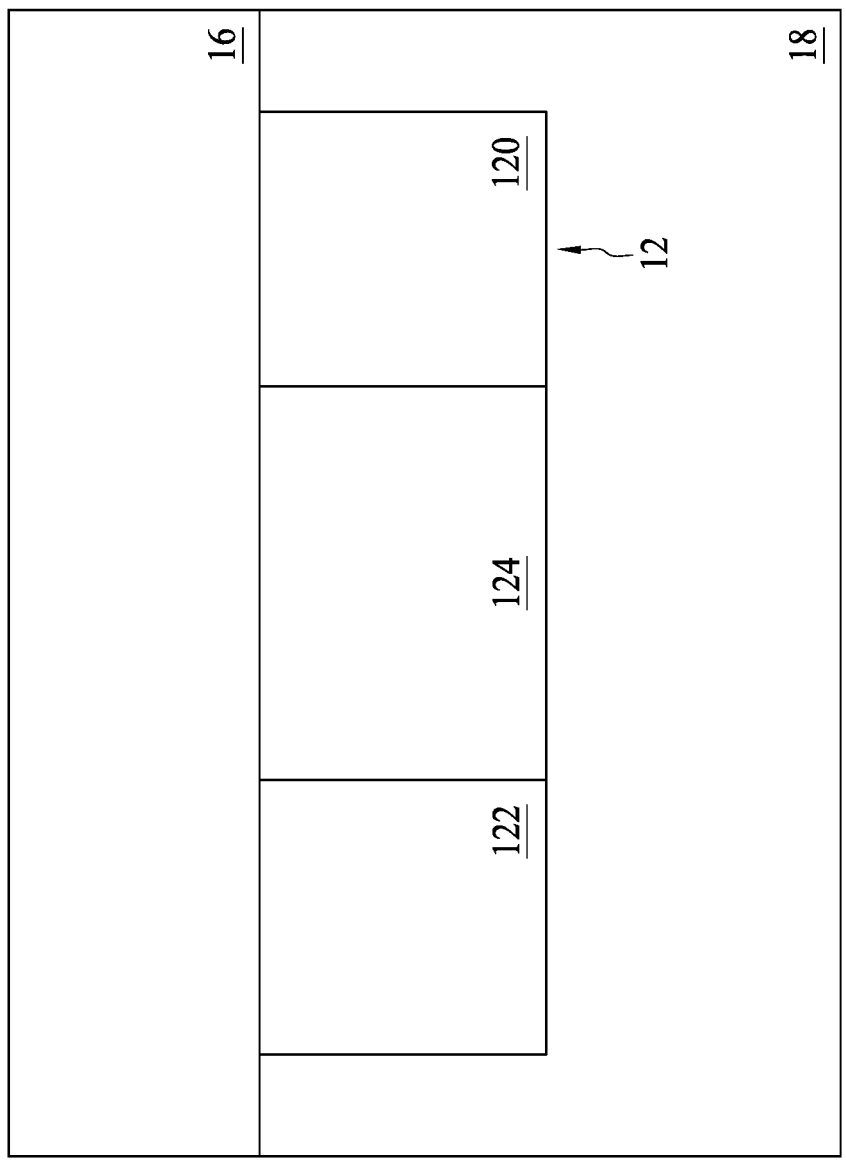

Referring to FIG. 1E, an insulating layer 16 is formed on the substrate 18 by, for example, a deposition process followed by a planarization process.

Figure 1F:
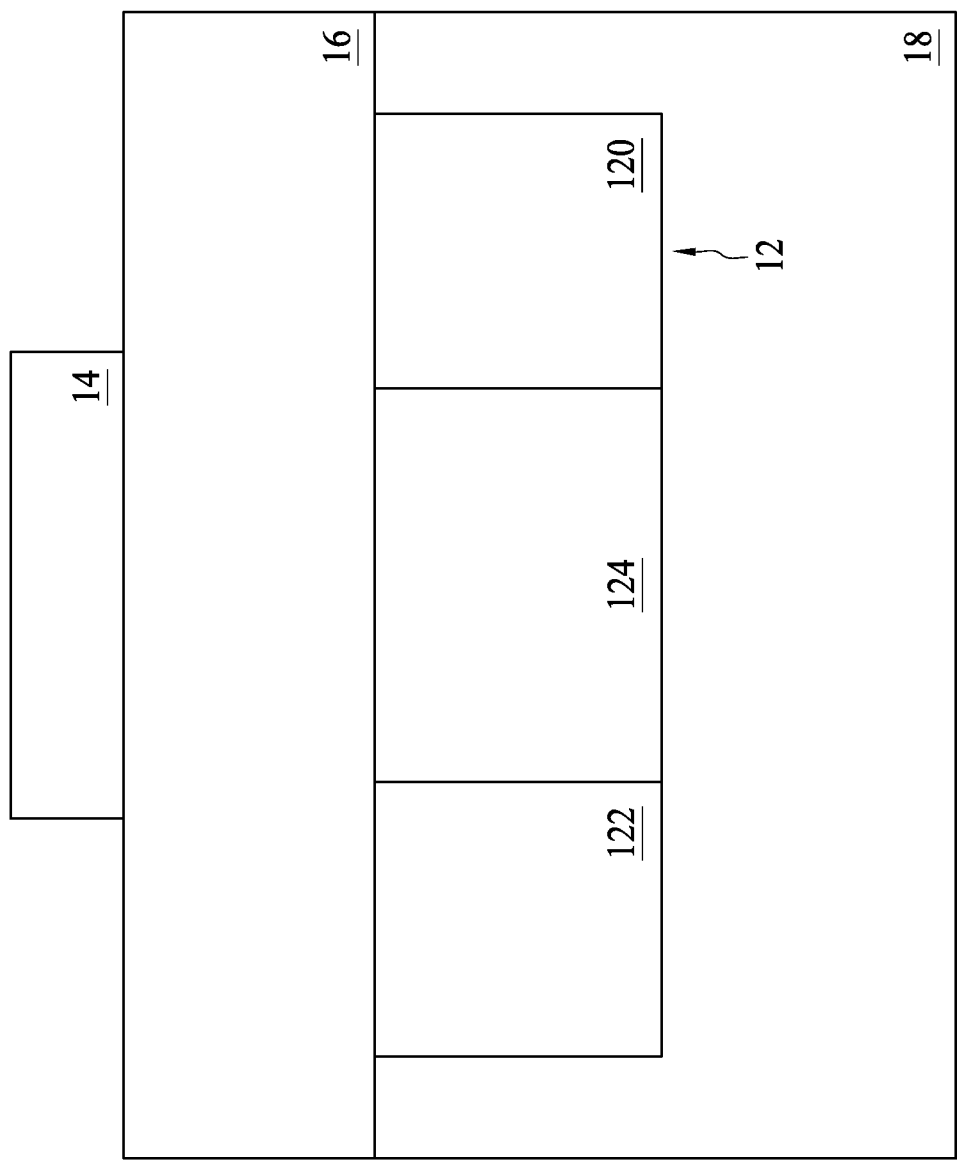

Referring to FIG. 1F, a patterned conductive layer 14 is formed on the substrate 16 and over the first well 124, the second well 120 and the third well 126 by, for example, a deposition process for depositing a metal-1 layer, followed by an etching process.

Figure 2A:
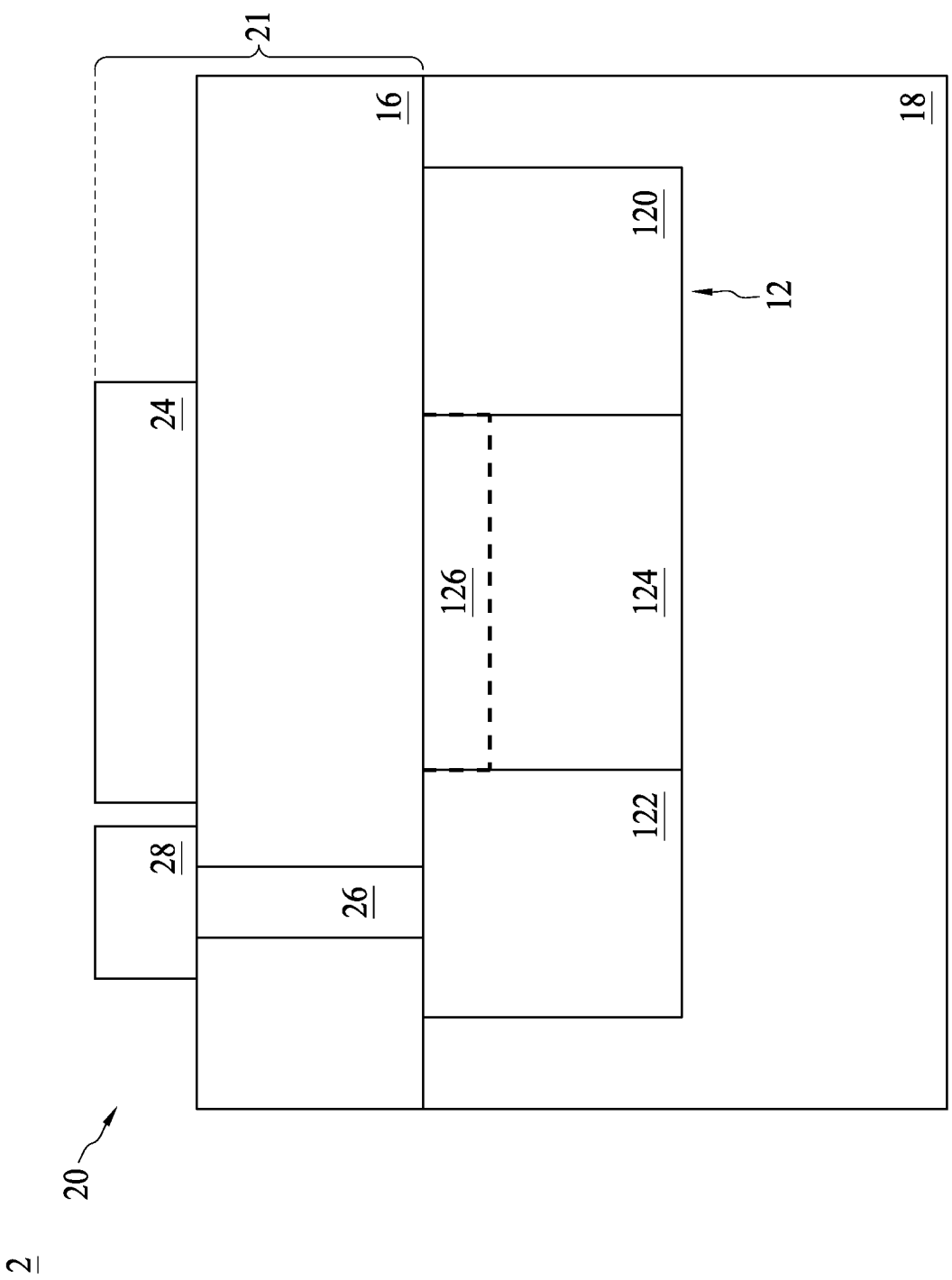
FIG. 2A is a cross-sectional view of a semiconductor device, in accordance with some embodiments of the present disclosure.

FIG. 2A is a cross-sectional view of a semiconductor device 2 for explaining routing, in accordance with some embodiments of the present disclosure. Referring to FIG. 2A, the semiconductor device 2 is similar to the semiconductor device 1 described and illustrate with reference to FIG. 1A except that, for example, the semiconductor device 2 includes a transistor 20, an interconnect feature 26 and an interconnect feature 28. The transistor 20 is similar to the transistor 10 described and illustrated with reference to FIG. 1A except that, for example, the transistor 20 includes a gate 21 further including a patterned conductive layer 24. The interconnect feature 26, which communicates the interconnect feature 28 to a second source/drain region 122 of the transistor 20, is configured for routing. Moreover, a heavily doped region (not shown) is formed in the second source/drain region 122 for ohmic contact with the interconnect feature 26. The interconnect feature 26 is formed as, for example, a contact in a semiconductor manufacturing process. Furthermore, the patterned conductive layer 24 serving as a gate electrode of the transistor 20 and the interconnect feature 28 are in the same interconnection layer such as a metal-1 (M1) layer in a semiconductor manufacturing process.

Figure 2B:
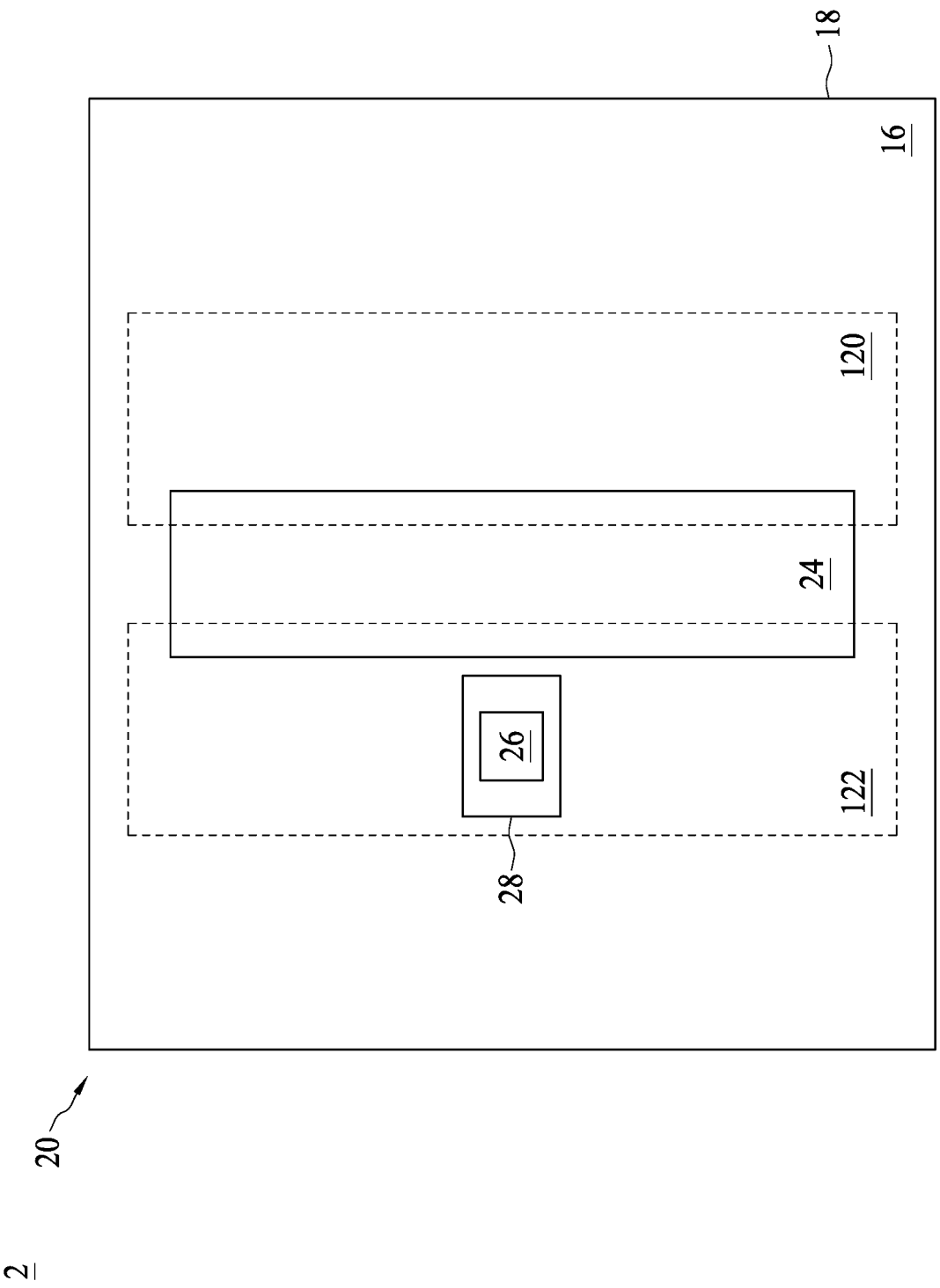
FIG. 2B is a layout view of the semiconductor device shown in FIG. 2, in accordance with some embodiments of the present disclosure.

FIG. 2B is a layout view of the semiconductor device 2 shown in FIG. 2, in accordance with some embodiments of the present disclosure. FIG. 2B is shown to better explain an application of the patterned conductive layer 24 and the interconnect feature 28 being in the same interconnection layer. Referring FIG. 2B, the patterned conductive layer 24 and the interconnect feature 28 are in the same interconnection layer, but independent of (or, separated from) each other. The interconnect feature 26 in the interconnect feature 28 communicates to the second source/drain region 122.

Figure 3A:
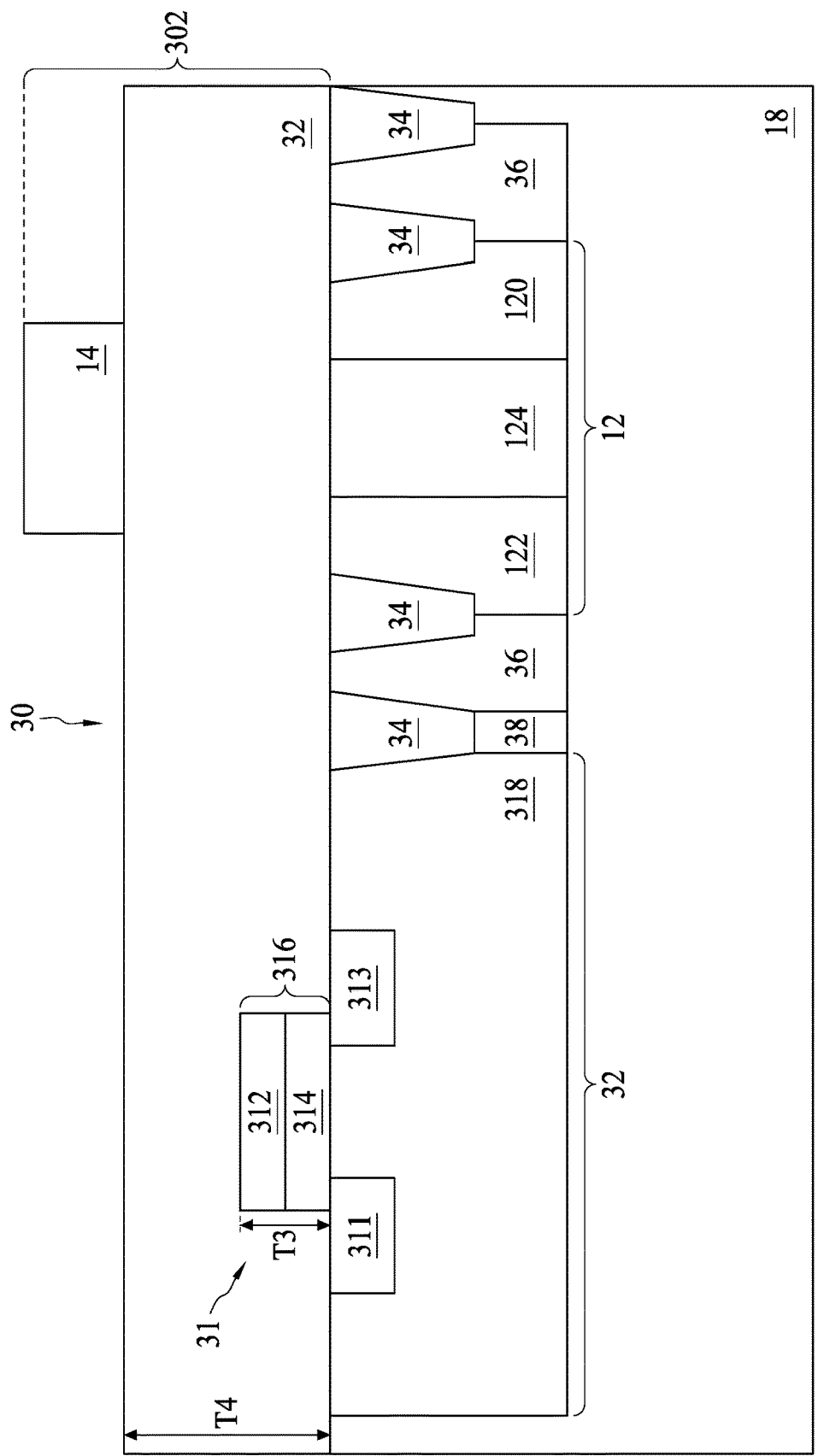
FIG. 3A is a cross-sectional view of a semiconductor device including a first transistor and a second transistor, in accordance with some embodiments of the present disclosure.

FIG. 3A is a cross-sectional view of a semiconductor device 3 including a first transistor 30 and a second transistor 31, in accordance with some embodiments of the present disclosure. Referring to FIG. 3A, the semiconductor device 3 is similar to the semiconductor device 1 described and illustrated with reference to FIG. 1A, except that the semiconductor device 3 includes the first transistor 30 operating in a first voltage domain and the second transistor 31 operating in a second voltage domain different from the first voltage domain. Specifically, the first transistor 30 operates in a relatively high voltage domain (such as, 3.3 V), and therefore is called a high voltage (HV) transistor. Contrarily, the second transistor 31 operates in a relatively low voltage domain (such as, 1.1 V or 1.2 V), and therefore is called a low voltage (LV) transistor. However, the second transistor 31 is not limited thereto, and may operate in a voltage domain other than the relatively low voltage domain. For example, the second transistor 31 operates in a normal voltage domain of 2.5 V. In that case, the second transistor 31 is called a normal voltage transistor.

The first transistor 30 is similar to the transistor 10 described and illustrated with reference to FIG. 1A except an insulating layer 32. Like the insulating layer 16 described and illustrated with reference to FIG. 1A, the insulating layer 32 also fully covers the substrate 18. Accordingly, the insulating layer 32 not only covers the active region 12 of the first transistor 30, but also an active region 32 of the second transistor 31. Moreover, the insulating layer 32 of a gate 302 of the first transistor 30 encapsulates the gate 316 of the second transistor 31. The insulating layer 32 has a thickness of T4, larger than a thickness T3 of the gate 316 of the second transistor 31. In some embodiments, the thickness of T4 is about 1200 angstrom (Å).

The active region 12 of the first transistor 30 is defined by a plurality of isolation structures 34. The isolation structure 34 may be filled with an insulator or dielectric material. In an embodiment, the isolation structure 34 includes a shallow trench isolation (STI). Alternatively, the isolation structure 34 includes a local oxidation of silicon (LOCOS) configuration. The isolation structure 34 includes silicon oxide, silicon nitride, silicon oxynitride, fluoride-doped silicate (FSG), and/or a low k dielectric material known in the art.

Moreover, the isolation structure 34 further defines the boundary of wells 36. The well 36 serves as a pick-up and is configured for electrical connection of the substrate 18. A voltage can be applied via the well 36 to the substrate 18.)

The second transistor 31 includes the gate 316 on the substrate 18 and the active region 32 in the substrate 18. The active region 32 includes a well 318, a first doped region 311 and a second doped region 313 in the well 318. Moreover, the well 318 is isolated from the well 36 by a well 38. The well 38 has a dopant type opposite to the well 318 and the well 36.

The well 318 includes a first dopant type, and the first doped region 311 and the second doped region 313 include a second dopant type opposite to the first dopant type. In the present embodiment, the well 318 is a p-well, the first doped region 311 and the second doped region 313 are n-type doped regions. As a result, the second transistor 31 includes an n-type transistor structure. The second transistor 31, for example, includes an n-type metal-oxide-semiconductor (NMOS), or an n-type metal-oxide-semiconductor field effect transistor (NMOSFET). Although only one gate structure is illustrated, it is understood that the transistor 31 may include a number of gate structures for NMOSs including short channel and long channel transistors.

Those skilled in the art will recognize that the embodiments disclosed herein by way of an NMOS transistor may also be applicable to a PMOS transistor, a p-type metal-oxide-semiconductor field effect transistor (PMOSFET), a PNP transistor, or the like. For example, the well 318 is an n-well, and the first doped region 311 and the second doped region 313 are p-type doped regions. Additionally, while the dopants discussed in specific terms and with reference to specific doping materials, concentrations and doping depths, those skilled in the art will recognize that alternative doping characteristics may be advantageously employed.

The gate 316 includes a gate oxide 314 on the substrate 18, and a poly 312, serving as a gate electrode, on the gate oxide 314. The gate 316 includes spacers at its sides, but for clarity of illustration, the spacers are omitted herein. Unlike some existing transistors designed for operating under a relatively high voltage, the second transistor 31 operates under a relatively low voltage, and a thickness of the gate oxide 314 is therefore relatively thin. Therefore, the thickness T3 of the gate 316 does not exceed that of a dielectric layer (i.e., in the present embodiment, as shown in FIG. 3A, the thickness T3 is thinner than the thickness T4), wherein the dielectric layer is adapted to insulate a gate from a patterned conductive layer for routing. The gate 316 of the second transistor 31 does not encounter the problems in the existing transistors designed for operating under a relatively high voltage.

In the present embodiment, for the second transistor 31, the insulating layer 32 serves as a dielectric layer for insulating the gate 316 and active region 32 from a patterned conductive layer (not shown) for routing. In contrast, for the first transistor 30, the insulating layer 32 serves as a gate oxide for the gate 302.

With an insulating layer serving as a gate oxide of a high voltage transistor and serving as a dielectric layer for a low or normal voltage transistor, the high voltage transistor and the low or normal voltage transistor can be integrated easily without complicating the semiconductor manufacturing process. Specifically, since the insulating layer 32 is taken as a gate oxide of the first transistor 30, a photolithography process is simplified and at least three masks are eliminated.

Figure 3B:
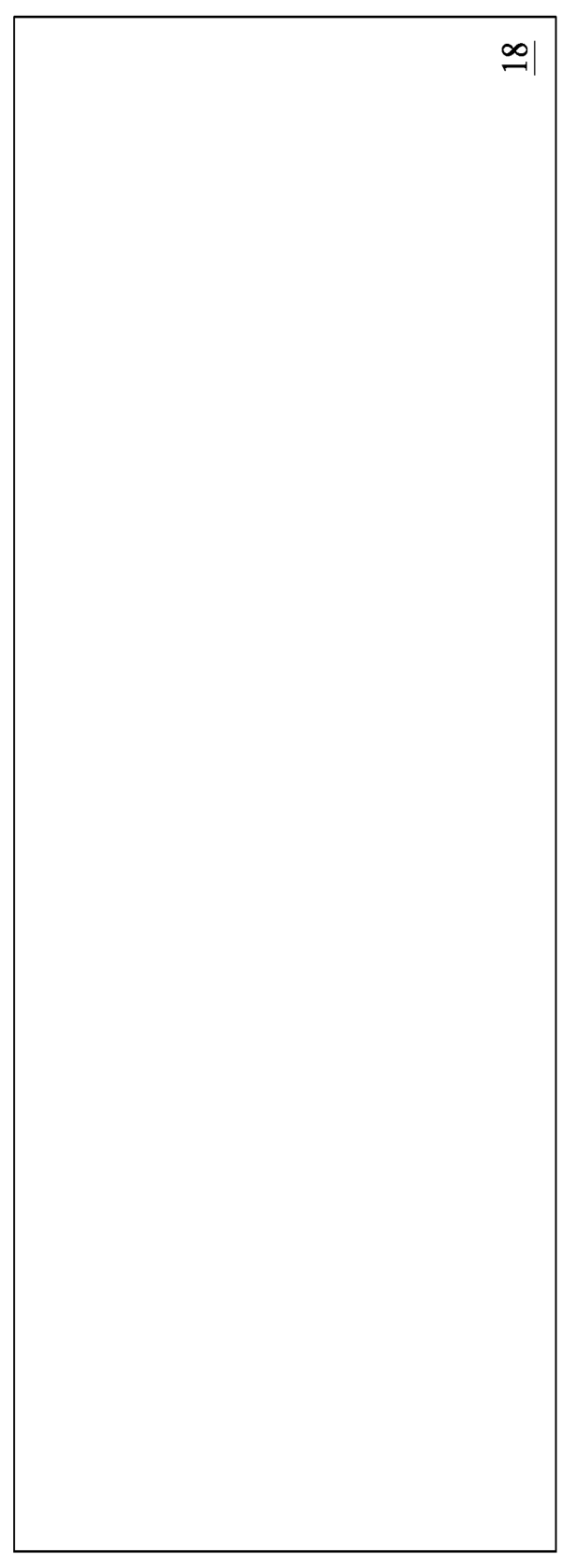

FIGS. 3B to 3G are diagrams showing a method of manufacturing the semiconductor device 3 shown in FIG. 3A, in accordance with some embodiments of the present disclosure. Referring to FIG. 3B, a substrate 18 is received. In some embodiments, the substrate 18 includes a p-type dopant.

Figure 3C:
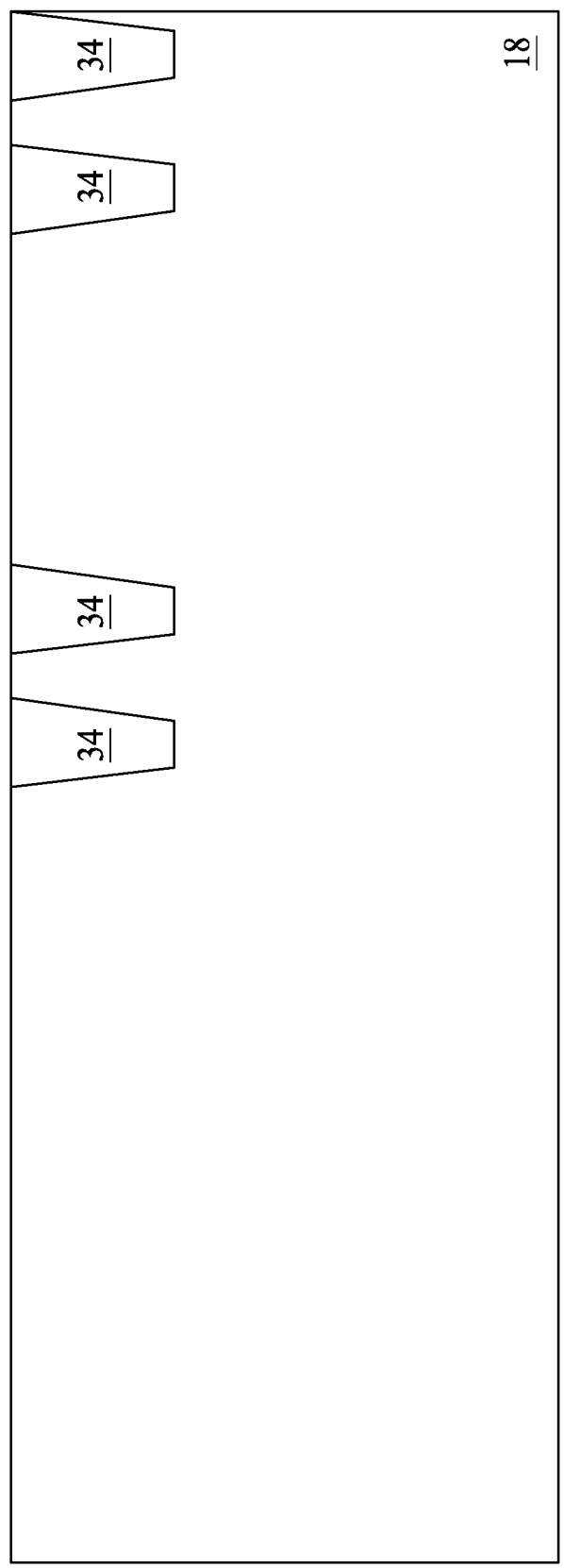

Referring to FIG. 3C, isolation structures 34 are formed in the substrate 18 by, for example, a deposition process, an etching process, a pullback process, an annealing process and a chemical mechanical planarization process sequentially performed in order. In an embodiment, the isolation structures 34 include an STI structure.

Figure 3D:
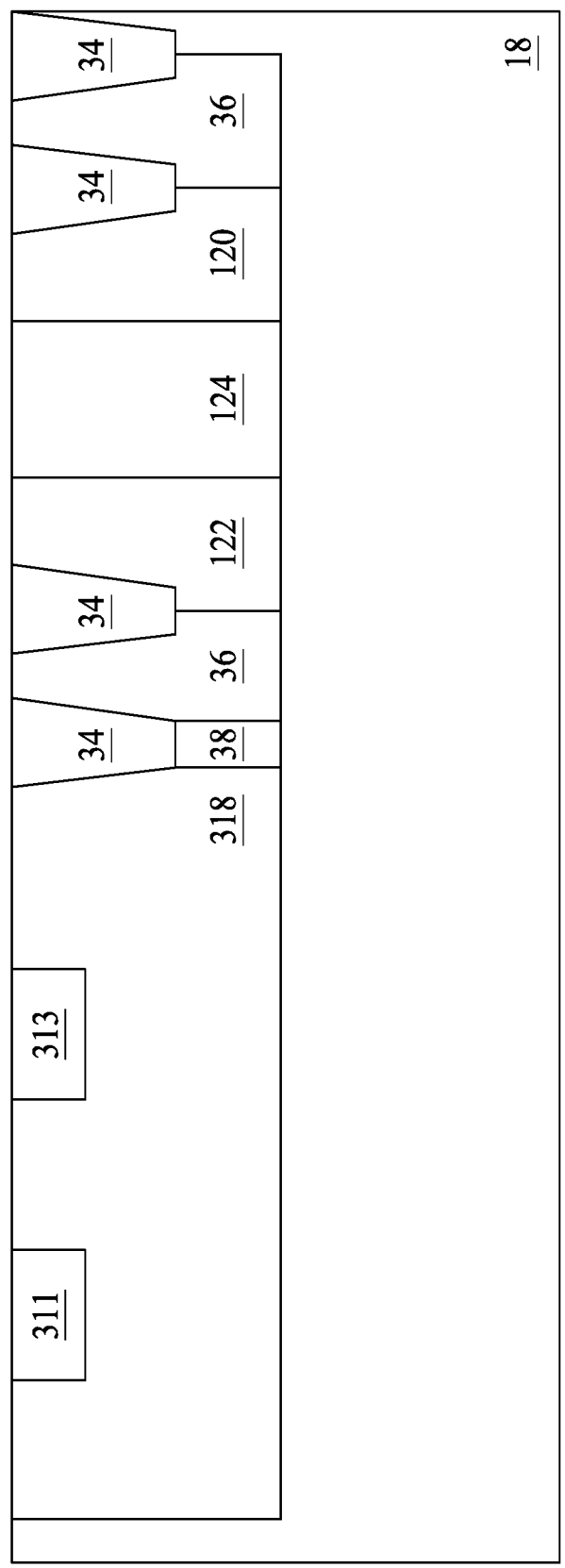

Referring to FIG. 3D, a first well 124, a second well 120, a third well 122, a well 36, wells 38 and a well 318 are defined in the substrate 18 by, for example, an ion implantation process followed by a drive-in process. In some embodiments, the first well 124 serves as a high voltage p-well (HVPW), the second well 120 serves as a high voltage n-well (HVNW), the third well 122 also serves as high voltage n-well, the wells 36 serve as a high voltage p-well and the well 38 serves as a high voltage n-well.

Afterwards, a first doped region 311 and a second doped region 313 are defined in the well 318 by, for example, an ion implantation process followed by a drive-in process. In some embodiments, the first doped region 311 and the second doped region 313 serve as n-type doped regions.

Figure 3E:
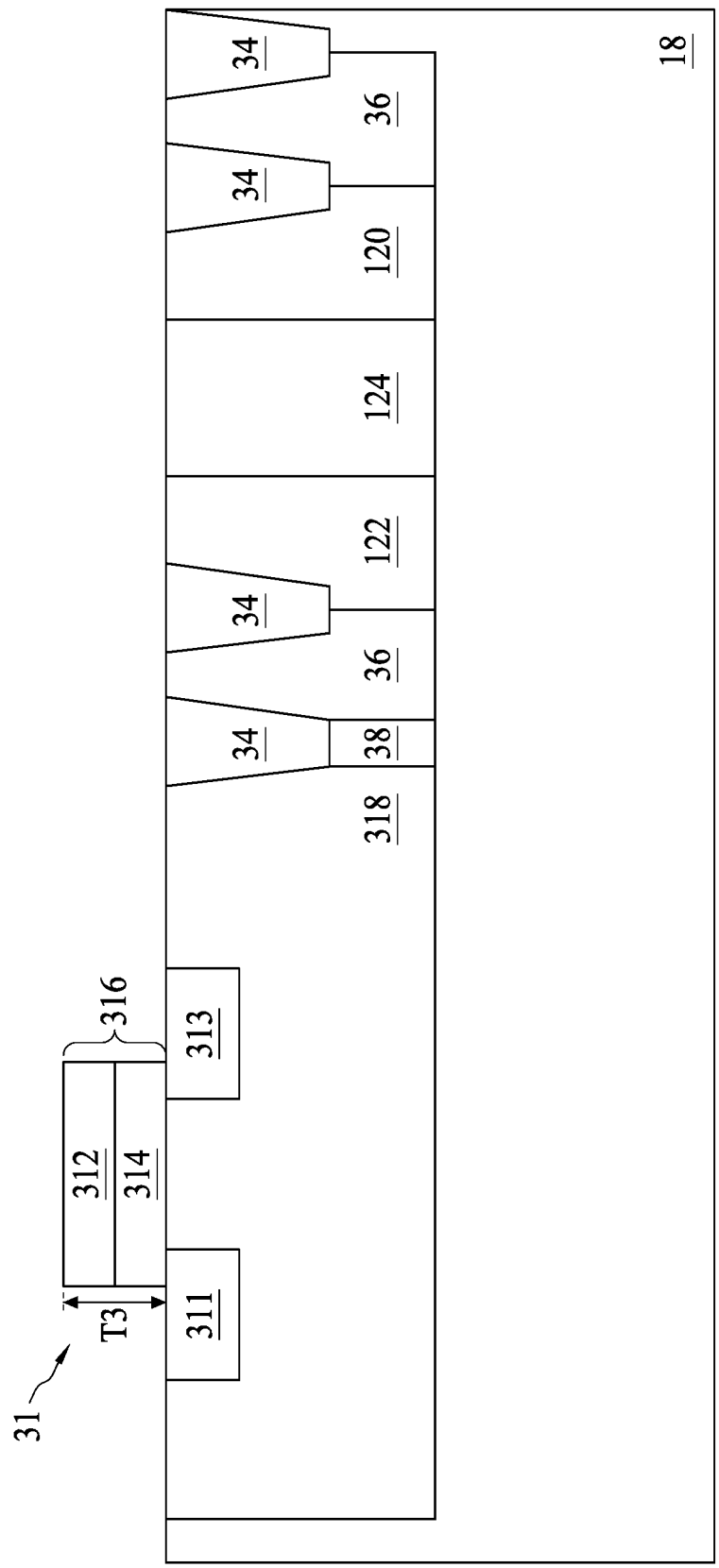

Referring to FIG. 3E, a gate oxide 314 is formed on the substrate 18 by, for example, a deposition process followed by a photolithography process. Afterwards, a poly 312 is formed on the gate oxide 314 by, for example, a deposition process followed by a photolithography process.

Figure 3F:
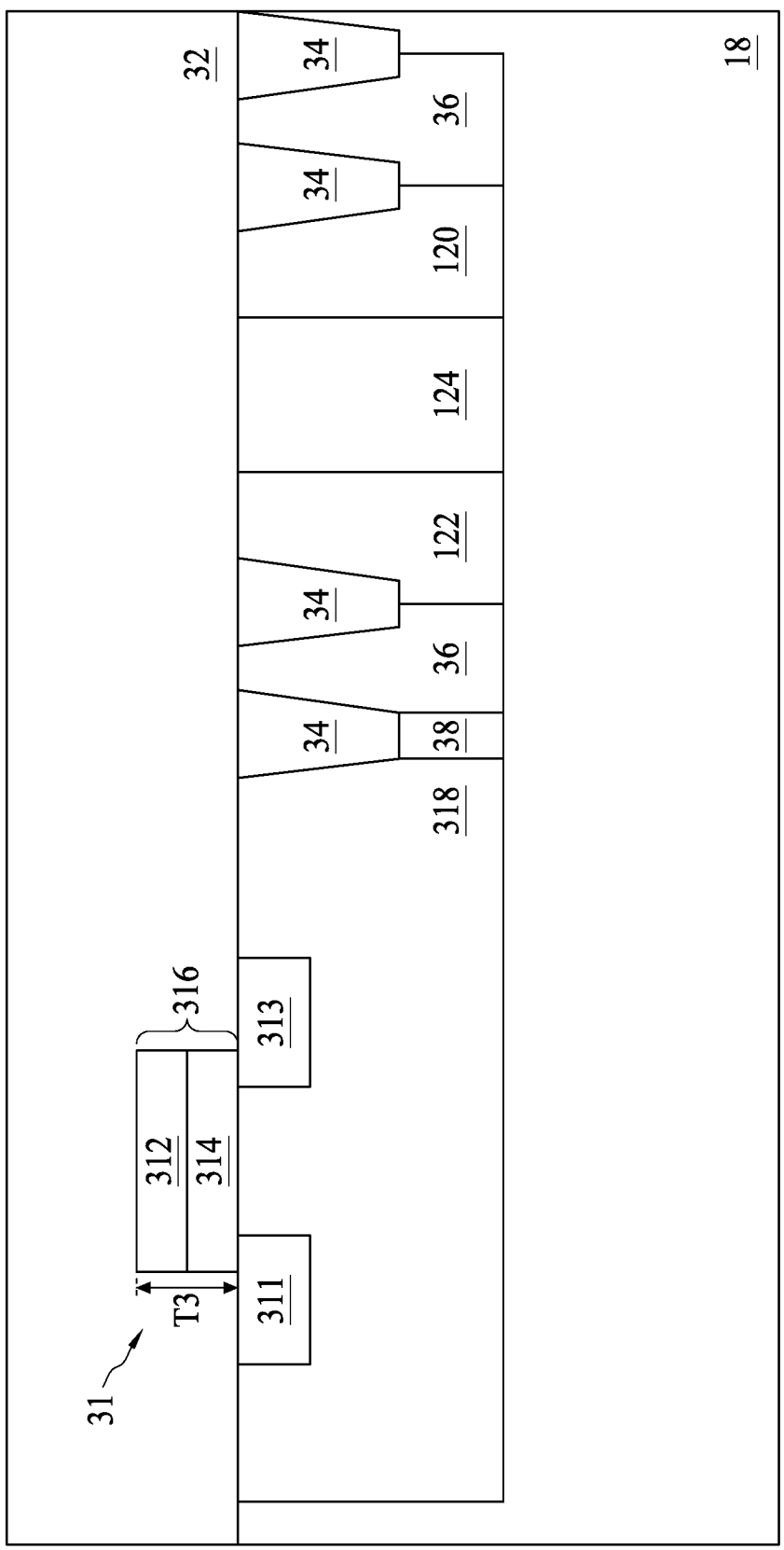

Referring to FIG. 3F, an insulating layer 32 is formed on the substrate 18 and the poly 312, by, for example, a deposition process followed by a planarization process such as a chemical mechanical polishing (CMP).

Figure 3G:
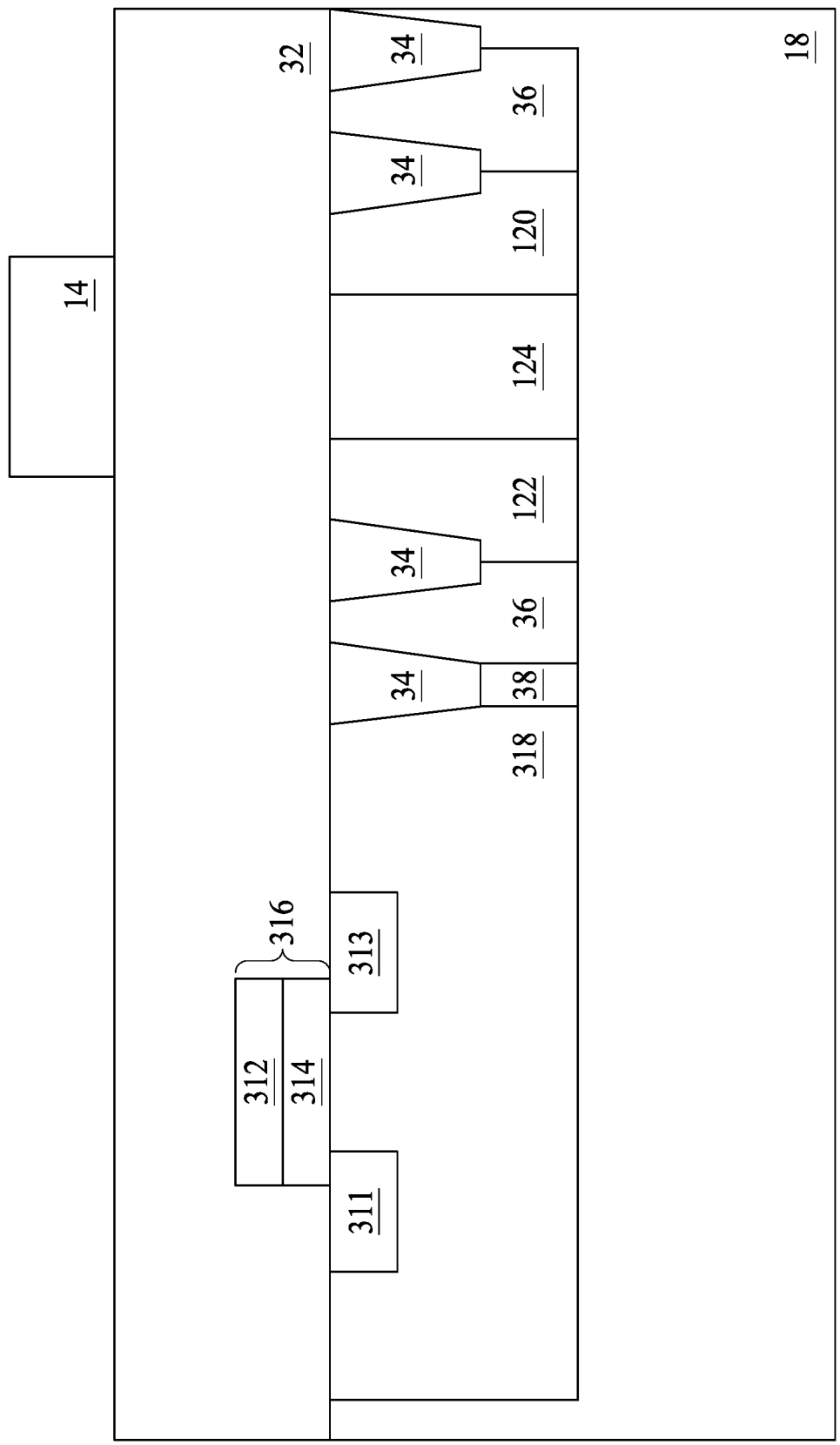

Referring to FIG. 3G, a patterned conductive layer 14 is formed on the insulate layer 32 over the first well 124 between the second well 120 and the third well 122 by, for example, a deposition process followed by an etching process.

Figure 4:
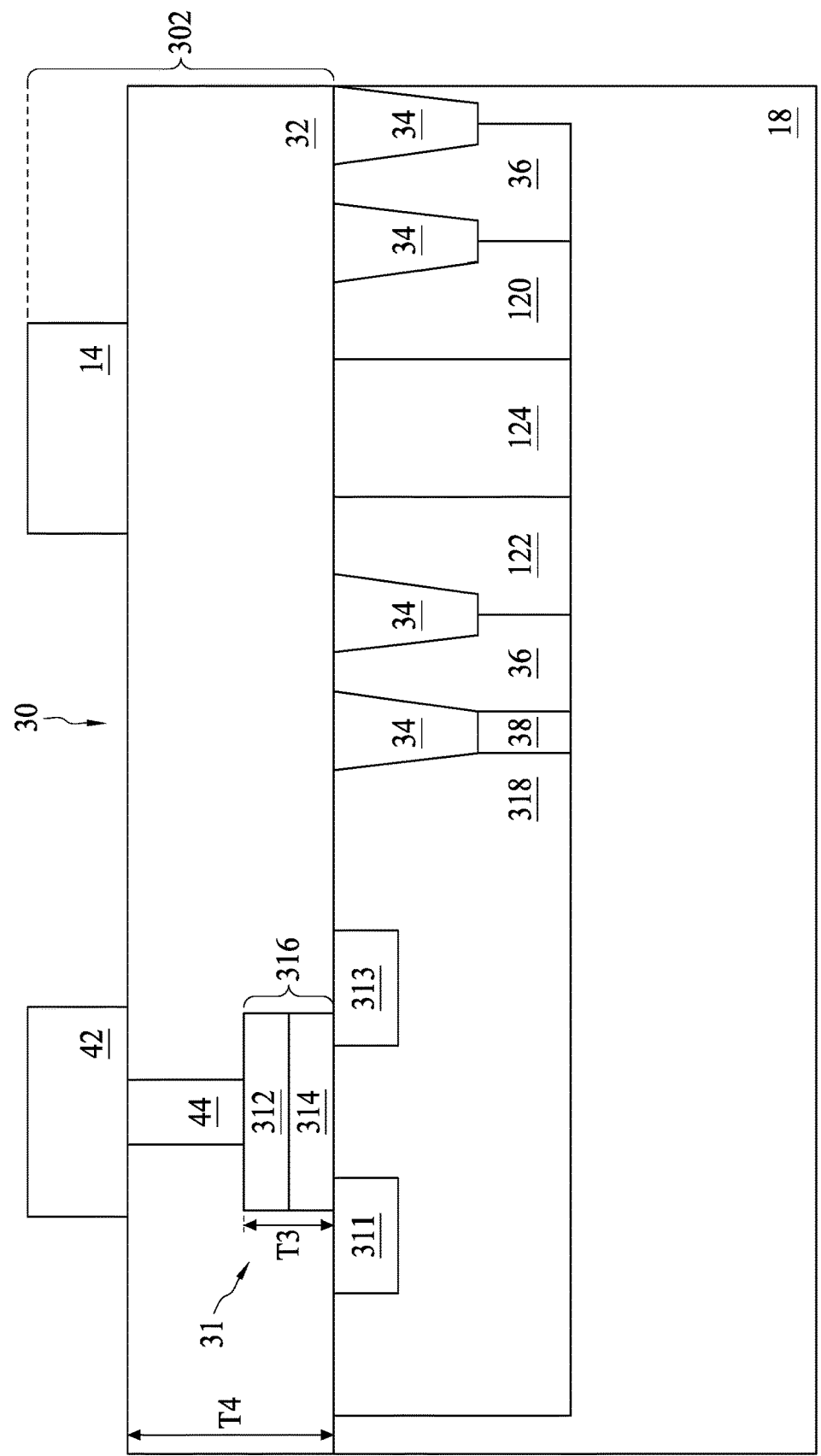
FIG. 4 is a cross-sectional view of a semiconductor device, in accordance with some embodiments of the present disclosure.

FIG. 4 is a cross-sectional view of a semiconductor device 4, in accordance with some embodiments of the present disclosure. Referring to FIG. 4, the semiconductor device 4 is similar to the semiconductor device 3 described and illustrated with reference to FIG. 3A except that, for example, the semiconductor device 4 further includes a patterned conductive layer 42 for routing of a second transistor 31. Moreover, the semiconductor device 4 includes an interconnect feature 44, in an insulating layer 32, configured to connect a gate 316 of the second transistor 31 to the patterned conductive layer 42. In the present embodiment, the patterned conductive layer 42 for routing of the second transistor 31 and a patterned conductive layer 14 for routing of the first transistor 30 are in the same conductive layer (or the same interconnection layer).

As discussed in the embodiment of FIG. 3A, in the semiconductor device 4, with the insulating layer 32 serving as a gate oxide of a high voltage transistor 30 and serving as a dielectric layer for a low or normal voltage transistor 31, the high voltage transistor 30 and the low or normal voltage transistor can be integrated together without complicating the semiconductor manufacturing process.

Figure 5:
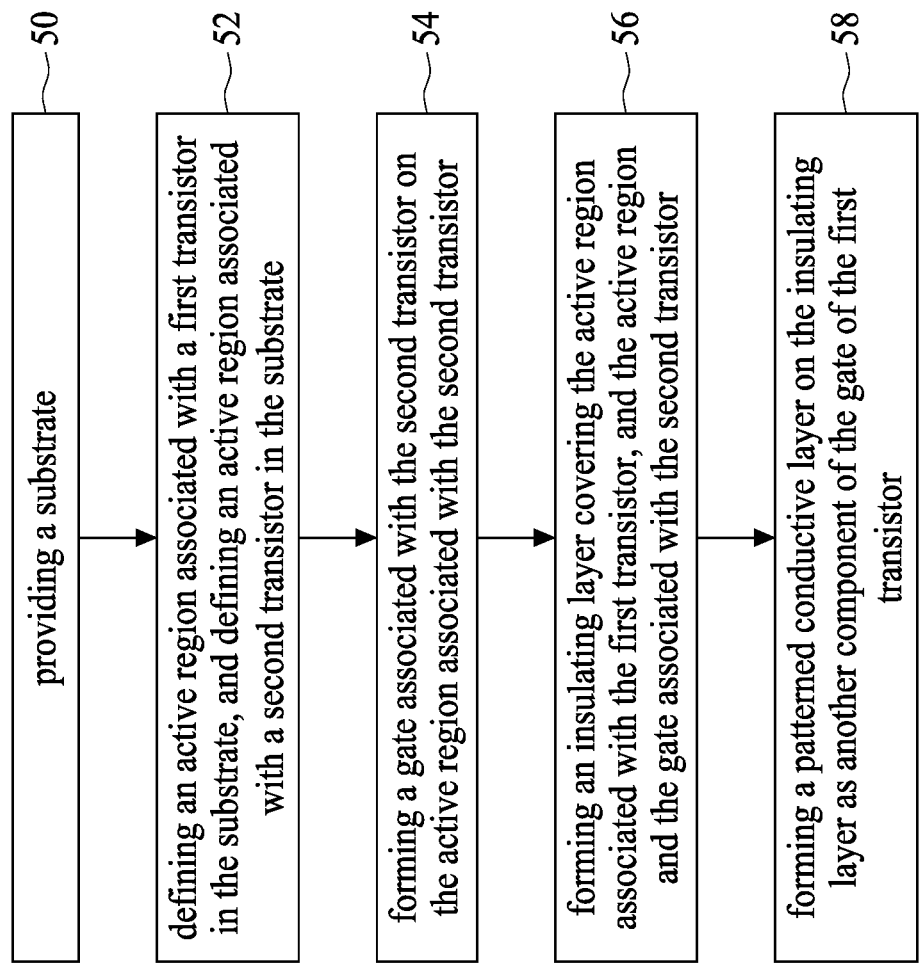
FIG. 5 is a flow chart illustrating a method of forming a semiconductor device, in accordance with some embodiments of the present disclosure.

FIG. 5 is a flow chart illustrating a method 5 of forming a semiconductor device, in accordance with some embodiments of the present disclosure. Referring to FIG. 5, in operation 50, a substrate is provided. The substrate is similar to the substrate 18 described and illustrated with reference to FIG. 3A.

In operation 52, a first active region associated with a first transistor is defined in the substrate, and a second active region associated with a second transistor is also defined in the substrate. The first active region associated with the first transistor is similar to the active region 12 described and illustrated with reference to FIG. 3A. Additionally, the second active region associated with the second transistor is similar to the active region 32 described and illustrated with reference to FIG. 3A.

In operation 54, a second gate associated with the second transistor is formed on the second active region associated with the second transistor. The second gate and the second active region define the second transistor. The second gate associated with the second transistor is similar to the gate 316 described and illustrated with reference to FIG. 3A.

In operation 56, an insulating layer covering the second gate, the second active region, the first active region and the substrate is formed. The insulating layer serves as a component of a first gate of a first transistor associated with the first active region. The insulating layer is similar to the insulating layer 32 described and illustrated with reference to FIG. 3A.

In operation 58, a patterned conductive layer serving as another component of the first gate of the first transistor is formed on the insulating layer. The first gate and the first active region define the first transistor. The patterned conductive layer is similar to the insulating layer 14 described and illustrated with reference to FIG. 3A.

In some embodiments of the present disclosure, a method of manufacturing a semiconductor device is disclosed. The method includes forming a dielectric layer configured to be a gate oxide contacting the second well on the substrate, wherein the dielectric layer is single-layered dielectric layer and includes a contact via penetrating through the dielectric layer; and forming a patterned conductive layer contacting the dielectric layer, wherein the patterned conductive layer includes a first conductive portion isolated from the second well and configured to be a gate electrode, and a second conductive portion coupled to the first well via the contact via; wherein the first conductive portion is leveled with the second conductive portion, and the first conductive portion and the second conductive portion are formed entirely on a topmost surface of the dielectric layer; wherein the dielectric layer and the first conductive portion collectively serve as a gate of the transistor, and the transistor is configured as a high-voltage transistor.

In some embodiments of the present disclosure, a method of manufacturing a semiconductor device is disclosed. The method includes forming an active region including a first well and a second well in a substrate; forming a dielectric layer configured to be a gate oxide on the substrate, wherein the dielectric layer contacts the second well and a top surface of the dielectric layer is horizontal, and the dielectric layer includes a contact via penetrating through the dielectric layer; forming a patterned conductive layer contacting the dielectric layer, wherein the patterned conductive layer includes a first conductive portion and a second conductive portion independent of each other, and the first conductive portion is configured to be a gate electrode and the second conductive portion is coupled to the first well via the contact via; wherein a bottommost surface of the first conductive portion is leveled with a bottommost surface of the second conductive portion, and the first conductive portion and the second conductive portion are formed entirely on a topmost surface of the dielectric layer; wherein the dielectric layer and the first conductive portion collectively serve as a gate of the transistor, and the interconnect feature is formed before the patterned conductive layer, and the transistor is configured as a high-voltage transistor.

In some embodiments of the present disclosure, a method of manufacturing a semiconductor device is disclosed. The method includes forming an active region including a first well and a second well in a substrate; defining a channel of a transistor in the second well; forming a dielectric layer configured to be a gate oxide on the substrate, wherein the dielectric layer includes a contact via coupled to the first well; and forming a patterned conductive layer on the dielectric layer, wherein the patterned conductive layer includes a first conductive portion configured to be a gate electrode and aligning to the second well, and a second conductive portion coupled to the first well via the contact via, and the second conductive portion is leveled with the first conductive portion; wherein the first conductive portion and the second conductive portion are formed entirely on a topmost surface of the dielectric layer; wherein the transistor is configured as a high-voltage transistor.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   forming an active region including a first well and a second well in a substrate;
   forming a dielectric layer configured to be a gate oxide contacting the second well on the substrate, wherein the dielectric layer is single-layered dielectric layer and includes a contact via penetrating through the dielectric layer; and
   forming a patterned conductive layer contacting the dielectric layer, wherein the patterned conductive layer includes a first conductive portion isolated from the second well and configured to be a gate electrode, and a second conductive portion coupled to the first well via the contact via;
   wherein the first conductive portion is leveled with the second conductive portion, and the first conductive portion and the second conductive portion are formed entirely on a topmost surface of the dielectric layer;

wherein the dielectric layer and the first conductive portion collectively serve as a gate of a transistor, and the transistor is configured as a high-voltage transistor.

2. The method of claim 1, wherein the formation of the dielectric layer comprises:
forming the dielectric layer fully covering the active region.

3. The method of claim 1, wherein the formation of the dielectric layer comprises:
forming the dielectric layer having a thickness of about 1200 angstrom.

4. The method of claim 1, further comprising:
defining a channel of the transistor in the second well.

5. The method of claim 1, further comprising:
forming the contact via by aligning the contact via to the first well.

6. The method of claim 1, wherein a projection of the second conductive portion in a vertical direction is entirely within the first well.

7. The method of claim 1, wherein the formation of the dielectric layer comprises:
forming the dielectric layer across the active region.

8. The method of claim 1, wherein the first conductive portion is disposed over the second well.

9. The method of claim 1, wherein a top surface of the dielectric layer is leveled with a horizontal plane.

10. A method of manufacturing a semiconductor device, comprising:
forming an active region including a first well and a second well in a substrate;
forming a dielectric layer configured to be a gate oxide on the substrate, wherein the dielectric layer contacts the second well and a top surface of the dielectric layer is horizontal, and the dielectric layer includes a contact via penetrating through the dielectric layer;
forming a patterned conductive layer contacting the dielectric layer, wherein the patterned conductive layer includes a first conductive portion and a second conductive portion independent of each other, and the first conductive portion is configured to be a gate electrode and the second conductive portion is coupled to the first well via the contact via;
wherein a bottommost surface of the first conductive portion is leveled with a bottommost surface of the second conductive portion, and the first conductive portion and the second conductive portion are formed entirely on a topmost surface of the dielectric layer;
wherein the dielectric layer and the first conductive portion collectively serve as a gate of a transistor, and the transistor is configured as a high-voltage transistor.

11. The method of claim 10, wherein the formation of the patterned conductive layer comprises:
forming the patterned conductive layer having the first conductive portion isolated from the second well, and the second conductive portion coupled to the second well.

12. The method of claim 10, wherein the formation of the dielectric layer comprises:
forming the dielectric layer fully covering the active region.

13. The method of claim 10, wherein the formation of the dielectric layer comprises:
forming the dielectric layer having a thickness of about 1200 angstrom.

14. The method of claim 10, wherein the first conductive portion is disposed over the second well.

15. A method of manufacturing a semiconductor device, comprising:
forming an active region including a first well and a second well in a substrate;
defining a channel of a transistor in the second well;
forming a dielectric layer configured to be a gate oxide on the substrate, wherein the dielectric layer includes a contact via coupled to the first well; and
forming a patterned conductive layer on the dielectric layer, wherein the patterned conductive layer includes a first conductive portion configured to be a gate electrode and aligning to the second well, and a second conductive portion coupled to the first well via the contact via, and the second conductive portion is leveled with the first conductive portion;
wherein the first conductive portion and the second conductive portion are formed entirely on a topmost surface of the dielectric layer;
wherein the transistor is configured as a high-voltage transistor.

16. The method of claim 15, further comprising:
forming the first well and the second well interfacing each other without forming an isolation structure between the first well and the second well.

17. The method of claim 15, further comprising:
forming the contact via by aligning the contact via to the first well.

18. The method of claim 17, wherein the formation of the dielectric layer comprises:
forming the dielectric layer on the substrate fully covering the substrate.

19. The method of claim 15, wherein the dielectric layer and the first conductive portion collectively serve as a gate of the transistor.

20. The method of claim 15, wherein the first conductive portion is disposed over the second well.

* * * * *